(12) United States Patent
Shum et al.

(10) Patent No.: US 9,196,482 B2
(45) Date of Patent: Nov. 24, 2015

(54) SOLUTION-BASED SYNTHESIS OF $CSSNI_3$

(76) Inventors: Kai Shum, Orefield, PA (US); Zhuo Chen, Brooklyn, NY (US); Yuhang Ren, Secaucus, NJ (US)

(*) Notice: Subject to any disclaimer, the term of this patent is extended or adjusted under 35 U.S.C. 154(b) by 709 days.

(21) Appl. No.: 13/491,562

(22) Filed: Jun. 7, 2012

(65) Prior Publication Data

US 2012/0306053 A1    Dec. 6, 2012

Related U.S. Application Data

(63) Continuation-in-part of application No. 13/151,243, filed on Jun. 1, 2011, now Pat. No. 8,529,797.

(51) Int. Cl.

| | | |
|---|---|---|
| A01B 11/00 | (2006.01) | |
| H01L 21/02 | (2006.01) | |
| C04B 35/515 | (2006.01) | |
| C04B 35/626 | (2006.01) | |
| C03C 17/22 | (2006.01) | |
| H01L 31/032 | (2006.01) | |
| H01L 31/0392 | (2006.01) | |
| H01L 31/18 | (2006.01) | |

(52) U.S. Cl.
CPC ......... *H01L 21/02628* (2013.01); *C03C 17/22* (2013.01); *C04B 35/5152* (2013.01); *C04B 35/6264* (2013.01); *H01L 21/0237* (2013.01); *H01L 21/02422* (2013.01); *H01L 21/02521* (2013.01); *H01L 31/032* (2013.01); *H01L 31/0392* (2013.01); *H01L 31/18* (2013.01); *C04B 2235/3201* (2013.01); *C04B 2235/3293* (2013.01); *Y02E 10/50* (2013.01)

(58) Field of Classification Search
None
See application file for complete search history.

(56) References Cited

U.S. PATENT DOCUMENTS

| | | | |
|---|---|---|---|
| 2008/0014463 A1* | 1/2008 | Varadarajan et al. | 428/690 |
| 2009/0092877 A1* | 4/2009 | Yoshikata | 429/30 |
| 2011/0180757 A1* | 7/2011 | Vockic et al. | 252/301.4 F |

* cited by examiner

*Primary Examiner* — Robert Vetere

(57) ABSTRACT

This invention discloses a solution-based synthesis of cesium tin tri-iodide ($CsSnI_3$) film. More specifically, the invention is directed to a solution-based drop-coating synthesis of cesium tin tri-iodide ($CsSnI_3$) films. $CsSnI_3$ films are ideally suited for a wide range of applications such as light emitting and photovoltaic devices.

13 Claims, 4 Drawing Sheets

US 9,196,482 B2

SOLUTION-BASED SYNTHESIS OF CSSNI$_3$

CROSS-REFERENCE TO RELATED APPLICATIONS

This invention is a continuation-in-part of U.S. non-provisional application Ser. No. 13/151,243, now U.S. Pat. No 8,529,797, filed Jun. 2, 2011, entitled: "PEROVSKITE SEMICONDUCTOR THIN FILM AND METHOD OF MAKING THEREOF". The disclosure of this non-provisional application is hereby incorporated by reference.

BACKGROUND OF THE INVENTION

The current thin-film photovoltaic technologies can be classified by the different materials used for the light absorption in a solar cell. These materials include amorphous and polycrystalline silicon, CdTe, $CuIn_xGa_{1-x}Se_2$(CIGS), GaAs, and photosensitive organic dyes. A transformative technology may emerge when a new and better material is being discovered for thin-film photovoltaic applications.

D. Scaife, P. Weller, and W. Fisher, reported an early study on the structural information of $CsSnI_3$ compound in form of powders, J. Solid State Chem. 9, 308 (1974).

P. Mauersberger and F. Huber, synthesized a yellow, needle-like $CsSnI_3$ microcrystal, and studied its crystal structure, Acta Cryst. B 36, 683 (1980).

K. Yamada, S. Funabiki, H. Horimoto, T. Matsui, T. Okuda, and S. Ichiba, reported the polymorph nature of $CsSnI_3$ compound, Chem. Lett. (The Chemical Society of Japan) 20, 801 (1991).

The black polymorph of $CsSnI_3$ could be obtained through a phase transition from the yellow polymorph $CsSnI_3$ by increasing its temperature above 425° K. It was further demonstrated by differential thermal analysis and X-ray diffraction that during the cooling of the black $CsSnI_3$ from 450° K, its ideal cubic perovskite structure (B-$\alpha$) deformed to a tetragonal structure (B-$\beta$) at 426° K, and became an orthorhombic structure (B-$\gamma$) below 351° K. Experimental studies of electrical and optical properties of this compound have been hindered by lack of high quality $CsSn_{I3}$ samples either in bulk or thin film format.

Aiming at the unique properties of hybrid organic-inorganic perovskites based on tin halides, I. Borriello, G. Gantel, and D. Ninno, recently calculated band structures of B-$\alpha$, B-$\beta$, and B-$\gamma$ from the first principles using the crystal structures published by Yamada et al., Phys. Rev. B 77, 235214 (2008). It was concluded that all three structures had direct band-gap ($E_g$) at Z, R, and $\Gamma$ points for B-$\alpha$, B-$\beta$, and B-$\gamma$, respectively, with $E_g$ (B-$\alpha$)<$E_g$ (B-$\beta$)<$E_g$ (B-$\gamma$).

A need still exists in the industry for developing low cost synthesis methods for $CsSnI_3$ thin films, especially in large scale. The successful implementation of these materials for various applications requires a detailed understanding of both their processing and materials properties.

BRIEF SUMMARY OF THE INVENTION

This invention is directed to solution-based synthesis of cesium tin tri-iodide ($CsSnI_3$) films. This invention is also directed to effective and inexpensive methods to synthesize the films on large-area substrates such as glass, ceramics, and metal foils.

One embodiment of this invention is directed to a process of forming $CsSnI_3$ film on a substrate, comprising steps of:
 (a) providing a substrate;
 (b) providing homogeneous $CsSnI_3$ solution;
 (c) drop-coating the homogeneous $CsSnI_3$ solution onto the substrate;
 (d) heating the substrate after step (c) until the substrate is dry; and
 (e) forming the $CsSnI_3$ film on the substrate.

Another embodiment of this invention is directed to a process of forming $CsSnI_3$ film on a substrate, comprising steps of:
 (a) providing a substrate;
 (b) provide CsI solution;
 (c) provide $SnCl_2$ solution;
 (d) drop-adding the CsI solution into the $SnCl_2$ solution to form a mixture;
 (e) stirring the mixture to make a homogeneous $CsSnI_3$ solution,
 (f) drop-coating the homogeneous $CsSnI_3$ solution onto the substrate;
 (g) heating the substrate after step (f) until the substrate is dry; and
 (h) forming the $CsSnI_3$ film on the substrate.

Yet, another embodiment of this invention is directed to $CsSnI_3$ films synthesized on a substrate by any one of the processes disclosed above.

In the process, the steps are performed under ambient condition; the substrate is selected from glass, ceramic, silicon, and metal foils; a ratio of the CsI solution to the $SnCl_2$ solution in the mixture ranges from about 1/10 to about 1/3.

The CsI solution is made by fully dissolving CsI powder (99.9% purity) in a solvent selected from the group consisting of water, deionized water, distilled water and mixtures thereof. The CsI solution is about 5 wt % to about 50 wt % CsI solution.

The $SnCl_2$ solution is made by fully dissolving $SnCl_2$ powder (99.9% purity) in a solvent selected from the group consisting of anhydrous alcohol, glacial acetic acid; ethylene glycol or triethylene glycol; and mixtures thereof. The $SnCl_2$ solution is about 5 wt % to about 80 wt % $SnCl_2$ solution.

DETAILED DESCRIPTION OF THE INVENTION

U.S. patent application Ser. No. 13,151,243 discloses the vacuum-powder-based synthesis and characterization of $CsSnI_3$ thin films. The precursor materials (powder) of CsI and $SnCl_2$ (or $SnI_2$) were alternately evaporated in a vacuum chamber on a substrate. The resulting $CsSnI_3$ thin-film was formed after a post-deposition thermal treatment. The CsSnI$_3$ thin films exhibit outstanding optical, electrical, and ferroelectric properties. These features make CsSnI$_3$ thin films ideally suited for a wide range of applications such as light emitting and photovoltaic devices.

More specifically, U.S. patent application Ser. No. 13,151,243 discloses that CsSnI$_3$ is a promising material in the application of thin-film solar cells, since CsSnI$_3$ was found to possess a direct band gap of 1.32 eV at room temperature, right in the narrow region of optimal band gaps for the Shockley-Queisser maximum efficiency limit of a solar cell.

An effective and inexpensive method to synthesize large domain size high quality perovskite semiconductor thin films on large-area substrates such as glass, ceramics, silicon, and metal foils are disclosed in the present invention.

More specifically, a non-vacuum, solution-based method to synthesize CsSnI$_3$ films is disclosed in the present invention. The films can be fabricated on inexpensive substrates such as glass, ceramics, silicon, and metal foils by the solution-based drop-coating. This non-vacuum-powder based demonstration of the CsSnI$_3$ film formation further enhances the likelihood of using CsSnI$_3$ as a new absorption material for solar cells.

WORKING EXAMPLES

The procedures of synthesizing polycrystalline CsSnI$_3$ film using solutions were described.

Figure 1:
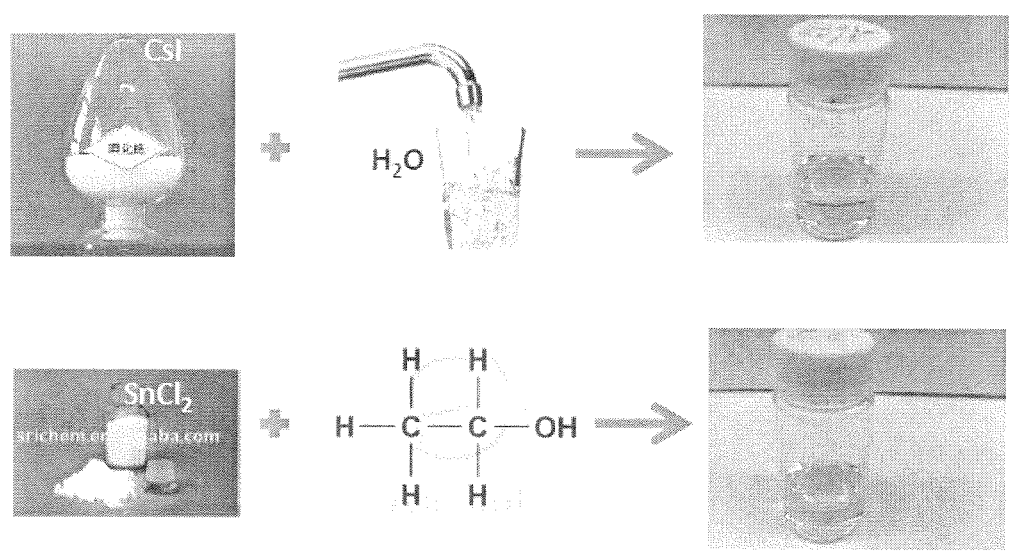
FIG. 1 shows the experimental setup for forming CsI and $SnCl_2$ solutions.

The solutions of precursor materials were synthesized in ambient conditions. The ambient conditions refer to: room temperature or temperature of 298.15° K. (or 25° C., 77° F.); and an absolute pressure of 100 kPa (or 14.504 psi, 0.986 atm). The experimental setup was shown in FIG. 1.

Example 1

Synthesis of CsI Solution 12 gram of CsI powder (99.9% purity) was added to 30 gram of deionized water to form 28.6 wt % (weight percent) CsI solution. The CsI powder was fully dissolved in deionized water. The CsI solution was stirred for 30 minutes.

CsI solution was colorless and stable in ambient conditions.

The CsI solution could comprise more CsI powder as long as the amount of CsI powder was fully dissolved in deionized water, and the CsI solution was colorless. CsI powder could dissolve in less than its own mass of water without apparent decomposition.

It would be apparent to one skilled in the art that CsI solutions could be made using any solvents other than those used in the examples. Examples of the solvent include but not limited to, water, distilled water, mixtures thereof.

The wt % range of the CsI solution was ranging from about 5.0 wt % to about 50.0 wt %, or from about 15 wt % to about 40 wt %.

Example 2

Synthesis of SnCl$_2$ Solution

An amount of 4 gram of SnCl$_2$ powder (99.9% purity) was added to 20 gram of anhydrous ethanol to form 16.7 wt % of solution. The SnCl$_2$ powder was fully dissolved in anhydrous ethanol to form the SnCl$_2$ solution. The solution was stirred for 30 minutes.

SnCl$_2$ solution was colorless and stable in ambient conditions.

The SnCl$_2$ solution could comprise more SnCl$_2$ powder as long as the amount of SnCl$_2$ powder was fully dissolved in anhydrous ethanol, and the solution was colorless.

It would be apparent to one skilled in the art that SnCl$_2$ solutions could be made using any solvents other than those used in the examples. Examples of the solvent include but not limited to, anhydrous alcohol, such as but not limited to, anhydrous methanol and anhydrous isopropyl; glacial acetic acid; ethylene glycol or triethylene glycol; and the mixtures thereof.

The wt % range of the SnCl$_2$ solution was ranging from about 20 wt % to about 80%, or from about 10 wt % to about 50 wt %.

Example 3

Synthesis of CsSnI$_3$ Film by Drop-Coating

A given amount of the prepared CsI solution was transferred to a reaction vial first. SnCl$_2$ solution was then slowly dropped into the vial by a pipet. The ratio of CsI solution to SnCl$_2$ solution was in a range of about 1/10 to about 1/3. CsSnI$_3$ was formed immediately as black grains suspending in the mixed solution. This phenomenon implied that the CsSnI$_3$ was neither soluble in DI water nor in ethanol.

After five minutes sonication (using ultrasonic vibrator), homogeneous black CsSnI$_3$ solution with CsSnI$_3$ black grains uniformly distributed in the solution, was formed. The homogeneous CsSnI$_3$ solution contained CsSnI$_3$ grains with a typical diameter of a few micrometers.

The homogeneous CsSnI$_3$ solution was drop-coated on a substrate, such as a microscope glass slide or a piece of ceramics.

After drop-coating, the substrate was heat treated at 70° C. for 5 minutes to remove residual solvents. SnCl$_2$ film with a thickness ~40 μm was obtained by drop-coating the homogeneous CsSnI$_3$ solution. The heating temperature ranged from about 50° C. to about 90° C.

Figure 2:
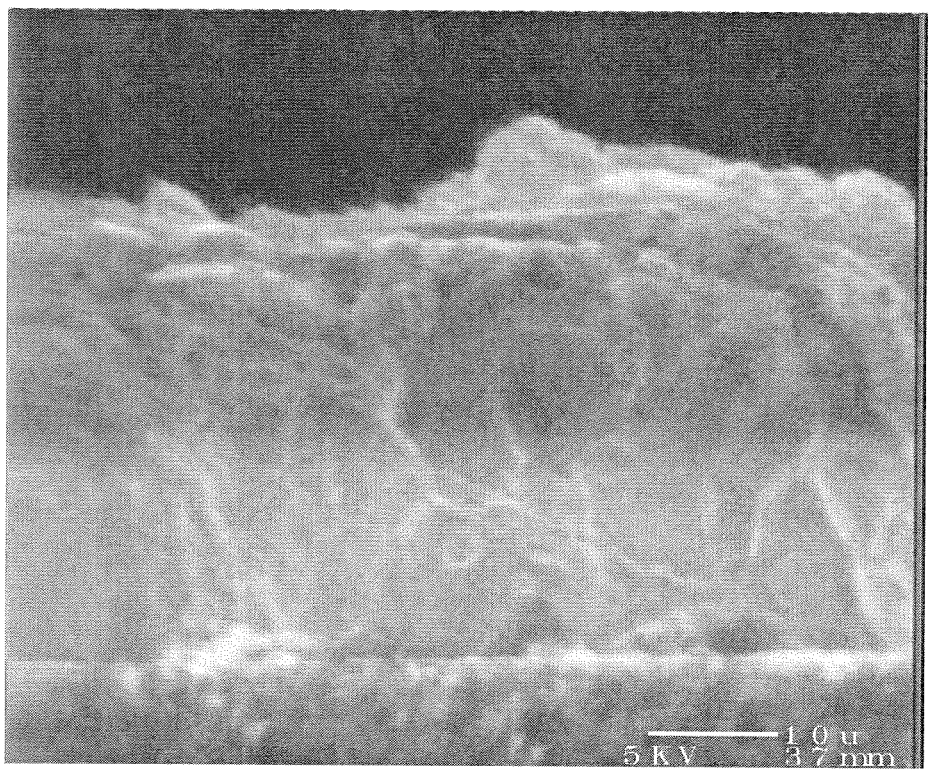
FIG. 2 shows the cross-sectional scanning electron micrographic (SEM) image of the cross-section of $CsSnI_3$ film deposited by solution-based drop-coating on a ceramic substrate using the $CsSnI_3$ containing solution.

The cross-sectional scanning electron micrographic (SEM) image taken from the film on a glass substrate was shown in FIG. 2. FIG. 2 indicated that the film was dense and filled with large polycrystalline domains ranging from a few micrometers to 10 μm.

The chemical reaction for the mixture of the solutions could be described as the following:

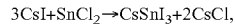

$$3CsI+SnCl_2 \rightarrow CsSnI_3+2CsCl,$$

The reaction was verified by identifying the end products of CsSnI$_3$ and CsCl using the X-ray diffraction (XRD) data to be discussed later.

Photoluminescence (PL) data and X-ray diffraction data (XRD) were used to identify CsSnI$_3$ and to characterize the crystalline quality of each individual domain.

PL spectra were taken from a Nanolog system from Horiba Jobin Yvon. The Nanolog system had a 450 W Xe-lamp light source, a double-grating excitation spectrometer to select a central excitation wavelength and its bandwidth, a sample compartment, and an emission spectrometer to spectrally select desired emission to a photomultiplier tube (Hamamatsu P2658P) coupled with single photon-counting electronic circuits.

A relative low photoexcitation level of ~20 mW cm$^{-2}$ was used.

Figure 3:
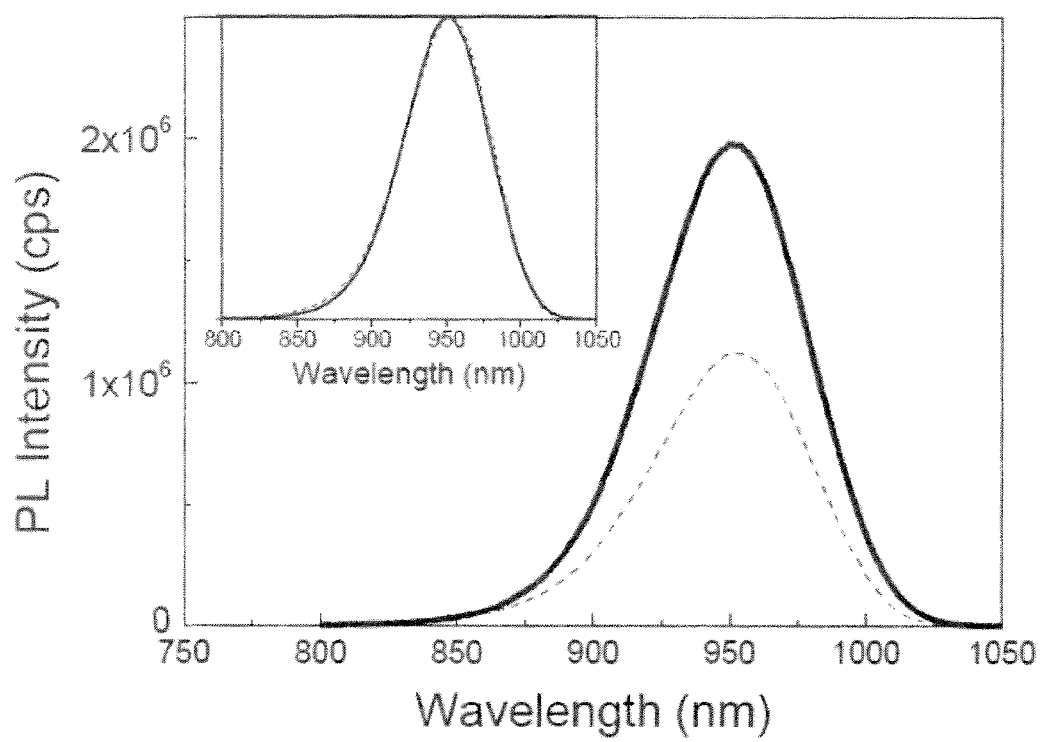
FIG. 3 shows photoluminescence (PL) spectra of $CsSnI_3$ film. The dashed line was taken from $CsSnI_3$ film made from the solution-based synthesis; the solid curve was taken from $CsSnI_3$ thin film made from the vacuum-powder-based synthesis. The inset displays the normalized photoluminescence (PL) spectra. The inset indicates that the spectra are the same for $CsSnI_3$ from solution-based and vacuum-powder-based synthesis.

As shown in FIG. 3, the PL intensity of a typical solution-based drop-coated CsSnI$_3$ film on a glass substrate was about half of the PL intensity taken from a typical thin-film synthesized from thermal evaporator powders by the vacuum-powder based method (as disclosed in U.S. patent application Ser. No. 13,151,243) under the identical excitation and PL collection conditions.

The PL line shape was identical for the solution-based and vacuum-powder based deposition or synthesis methods as displayed in the inset of the FIG. 3. This result strongly suggested that the CsSnI$_3$ film quality was compatible using two different synthesis methods.

XRD data were used not only to further verify the crystal structure of CsSnI$_3$ but importantly also to identify the side products when the CsI solution was formed as the end products and mixed with the SnCl$_2$ solution (as shown in the reaction).

Figure 4:
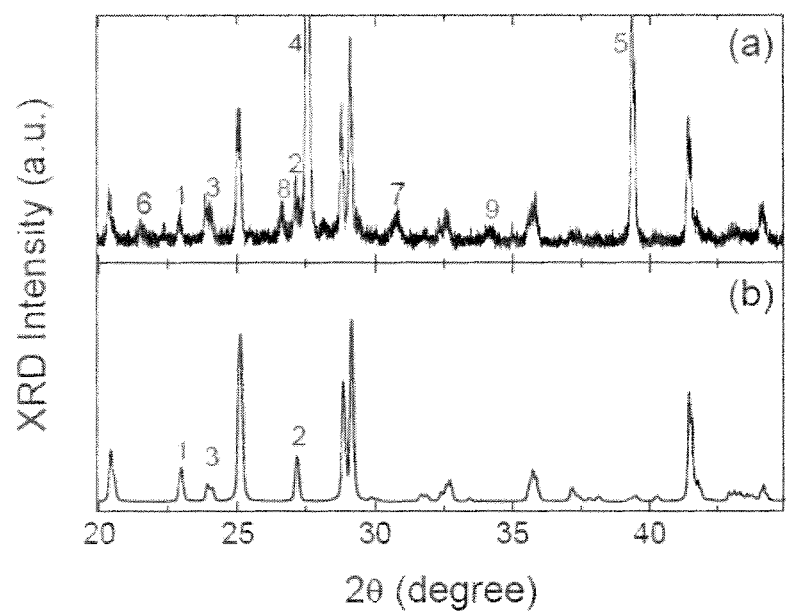
FIG. 4 shows (a) X-ray diffraction data (XRD) profile taken from $CsSnI_3$ film as shown in FIG. 2, and (b) theoretical calculated XRD profile using orthorhombic crystal structure of $CsSnI_3$.

FIG. 4(*a*) showed the XRD data measured from the same drop-coated CsSnI$_3$ film used for taking the SEM image in FIG. 2.

FIG. 4(*b*) showed theoretical calculated XRD profile by using a commercial software package CASTEP written by researchers at the Universities of York, Durham, St. Andrews, Cambridge and Rutherford Labs, using orthorhombic crystal structure of CsSnI$_3$. CASTEP uses density functional theory with a plane wave basis set to calculate the electronic properties of crystalline solids and other materials from first principles.

All the measured peaks were accounted for and sorted into four groups.

The first group consisted of the peaks of 1 to 3 and all others not number-labeled. These peaks were originated from the orthorhombic structure of CsSnI$_3$ and match the calculated XRD profile, as taught by CASTEP, as shown in FIG. 4(*b*).

Peaks 1 and 2 reflected the expected XRD features of the Sn—I—Sn bond tilting) (163° in the a- and b-direction, respectively, in reference to the cubic-structure of CsSnI$_3$.

Peak 3 represented the signature of the Sn—I—Sn bond tilting (170°) in the c-direction in reference to the tetragonal structure of CsSnI$_3$.

The second group included the peaks of 4 and 5. Those peaks were originated from the residual material CsI.

The peaks of 6 and 7 made up the third group. The peaks of 6 and 7 were originated from CsCl, leading to the unambiguous determination of the chemical reaction as the CsI solution was transferred into the SnCl$_2$ solution to form CsCl.

Finally, the presence of peaks 8 and 9 made up the fourth group. The peaks 8 and 9 matched Sn (IV) dioxide, SnO$_2$. It should be mentioned here that the absence of XRD peaks associated with the residual SnCl$_2$ strongly suggested that the chemical reaction under the ambient conditions resulting in favor of CsSnI$_3$ formation.

In summary, CsSnI$_3$ were synthesized using the CsI and SnCl$_2$ solutions.

A solution-based method, capable of large-scale production, was employed to fabricate CsSnI$_3$ films at a low cost, especially suitable for solar cell applications. The film polycrystalline quality was characterized by SEM, PL, and XRD data. Those data was verified to be comparable to that of similar thin-films synthesized by the vacuum-powder-based evaporation method.

While the invention has been described in detail and with reference to specific examples and the embodiments thereof, it will be apparent to one skilled in the art that various changes and modifications can be made therein without departing from the spirit and scope thereof.

The invention claimed is:

1. A process of forming CsSnI$_3$ film on a substrate, comprising steps of:
   (a) providing a substrate;
   (b) providing homogeneous CsSnI$_3$ solution;
   (c) drop-coating the homogeneous CsSnI$_3$ solution onto the substrate;
   (d) heating the substrate after step (c) to remove solvent in the homogeneous CsSnI$_3$ solution until the substrate is dry; and
   (e) forming the CsSnI$_3$ film on the substrate.

2. The process of claim 1, wherein the steps (a) to (c) are performed under ambient condition; the step (d) is performed at a temperature ranging from about 50° C. to about 90° C.; and the substrate is selected from glass, ceramic, silicon, and metal foils.

3. The process of claim 1, wherein the homogeneous CsSnI3 solution is formed by drop-adding a SnCl$_2$ solution into a CsI solution to form a CsSnI$_3$ solution; and stirring the CsSnI$_3$ solution to form the homogeneous CsSnI$_3$ solution; wherein a ratio of the CsI solution to the SnCl$_2$ solution ranges from about 1/10 to about 1/3.

4. The process of claim 3, wherein
   the CsI solution is about 5 wt % to about 50 wt % CsI solution by fully dissolving CsI powder (99.9% purity) in a solvent; and
   the SnCl$_2$ solution is about 5 wt % to about 80 wt % SnCl$_2$ solution by fully dissolving SnCl$_2$ powder (99.9% purity) in a solvent.

5. The process of claim 4, wherein
   the solvent for dissolving CsI powder (99.9% purity) is selected from the group consisting of water, deionized water, distilled water and mixtures thereof;
   and
   the solvent for dissolving SnCl$_2$ powder (99.9% purity) is selected from the group consisting of anhydrous alcohol, glacial acetic acid; ethylene glycol or triethylene glycol; and mixtures thereof.

6. The process of claim 4, wherein
   the solvent for dissolving CsI powder (99.9% purity) is selected from the group consisting of water, deionized water, distilled water and mixtures thereof; and the CsI solution is about 15 wt % to about 40 wt % CsI solution; and
   the solvent for dissolving SnCl$_2$ powder (99.9% purity) is selected from the group consisting of anhydrous ethanol, anhydrous methanol, anhydrous isopropyl and mixtures thereof; and the SnCl$_2$ solution is about 20 wt % to about 50 wt % SnCl$_2$ solution.

7. The process of claim 6, wherein
   the steps (a) to (c) are performed under ambient condition; the step (d) is performed at a temperature ranging from about 50° C. to about 90° C.;
   the substrate is selected from glass, ceramic, silicon, and metal foils; the solvent for dissolving CsI powder (99.9% purity) is selected from the group consisting of deionized water, distilled water and mixtures thereof; and
   the solvent for dissolving SnCl$_2$ powder (99.9% purity) is anhydrous ethanol.

8. A process of forming CsSnI$_3$ on a substrate, comprising steps of:
   (a) providing a substrate;
   (b) provide CsI solution;
   (c) provide SnCl$_2$ solution;
   (d) drop-adding the SnCl$_2$ solution into the CsI solution to form a CsSnI$_3$ solution;
   (e) stirring the CsSnI$_3$ solution to make a homogeneous CsSnI$_3$ solution, (f) drop-coating the homogeneous CsSnI₃ solution onto the substrate;
(g) heating the substrate after step (f) to remove solvent in the homogeneous CsSnI₃ solution until the substrate is dry; and
(h) forming the CsSnI₃ film on the substrate.

9. The process of claim 8, wherein the process steps (a) to (f) are performed under ambient condition; the step (g) is performed at a temperature ranging from about 50° C. to about 90° C.; and the substrate is selected from glass, ceramic, silicon, and metal foils.

10. The process of claim 8, wherein
the CsI solution in (b) is about 5 wt % to about 50 wt % CsI solution by fully dissolving CsI powder (99.9% purity) in a solvent; the SnCl₂ solution in (c) is about 5 wt % to about 80 wt % SnCl₂ solution by fully dissolving SnCl₂ powder (99.9% purity) in a solvent; and
a ratio of the CsI solution to the SnCl₂ solution ranges from about 1/10 to about 1/3.

11. The process of claim 10, wherein
the solvent for dissolving CsI powder (99.9% purity) is selected from the group consisting of water, deionized water, distilled water and mixtures thereof; and
the solvent for dissolving SnCl₂ powder (99.9% purity) is selected from the group consisting of anhydrous alcohol, glacial acetic acid; ethylene glycol or triethylene glycol; and mixtures thereof.

12. The process of claim 10, wherein
the solvent for dissolving CsI powder (99.9% purity) is selected from the group consisting of water, deionized water, distilled water and mixtures thereof; and the CsI solution is about 15 wt % to about 40 wt % CsI solution; and
the solvent for dissolving SnCl₂ powder (99.9% purity) is selected from the group consisting of anhydrous ethanol, anhydrous methanol, anhydrous isopropyl and mixtures thereof; and the SnCl₂ solution is about 20 wt % to about 50 wt % SnCl₂ solution.

13. The process of claim 12, wherein
the steps (a) to (f) are performed under ambient condition; the step (g) is performed at a temperature ranging from about 50° C. to about 90° C.;
the substrate is selected from glass, ceramic, silicon, and metal foils;
the solvent for dissolving CsI powder (99.9% purity) is selected from the group consisting of deionized water, distilled water and mixtures thereof; and
the solvent for dissolving SnCl₂ powder (99.9% purity) is anhydrous ethanol.

\* \* \* \* \*